US008194035B2

(12) United States Patent
Yoshikawa

(10) Patent No.: US 8,194,035 B2

(45) Date of Patent: Jun. 5, 2012

(54) INSTRUCTION INPUTTING DEVICE

(75) Inventor: Osamu Yoshikawa, Tokyo (JP)

(73) Assignee: SMK Corporation, Tokyo (JP)

( * ) Notice: Subject to any disclaimer, the term of this patent is extended or adjusted under 35 U.S.C. 154(b) by 820 days.

(21) Appl. No.: 12/350,526

(22) Filed: Jan. 8, 2009

(65) Prior Publication Data

US 2009/0266622 A1 Oct. 29, 2009

(30) Foreign Application Priority Data

Apr. 25, 2008 (JP) ................................ 2008-115241

(51) Int. Cl.
*G09G 5/00* (2006.01)

(52) U.S. Cl. ...................... 345/156; 345/173; 178/18.01

(58) Field of Classification Search .................. 345/156, 345/173; 178/18.01
See application file for complete search history.

(56) References Cited

U.S. PATENT DOCUMENTS 6,433,781 B1 * 8/2002 Oda et al. ...................... 345/167
6,522,320 B1 * 2/2003 Chou ........................... 345/157
7,265,686 B2 * 9/2007 Hurst et al. ..................... 341/33
7,321,361 B2 * 1/2008 Sato et al. ...................... 345/173
7,382,139 B2 * 6/2008 Mackey ........................ 324/660
7,692,431 B2 * 4/2010 Mackey ........................ 324/660
2001/0000125 A1 * 4/2001 Zimmerman et al. ........ 345/161
2002/0149566 A1 * 10/2002 Sarkissian ..................... 345/168
2004/0046735 A1 * 3/2004 Gombert et al. .............. 345/156

FOREIGN PATENT DOCUMENTS

JP 2003-91360 A 3/2003
JP 2004-94450 A 3/2004

* cited by examiner

*Primary Examiner* — Nitin Patel
*Assistant Examiner* — Sahlu Okebato
(74) *Attorney, Agent, or Firm* — Edwards Wildman Palmer LLP; Peter C. Schechter; Adam P. Daniels

(57) ABSTRACT

An instruction inputting device detects input operations in the XY plane and in a rotational direction on a hemispherical input operation surface. Four detection electrodes insulated from each other are formed at 90° intervals around the Z axis of the hemisphere, on the surface of a spherical crown-shaped insulator. Surface areas of each of the detection electrodes decrease moving toward an apex P on the Z axis and moving in a circumferential direction away from the positions at which the 90° intervals are formed. As a result, the surface areas of the detection electrodes facing an object to be detected for causing the input operation differ depending on the positioning of the object, thereby causing differences in the floating capacitances of the detection electrodes which are sensed by a circuit portion of the device.

19 Claims, 5 Drawing Sheets

INSTRUCTION INPUTTING DEVICE

CROSS REFERENCE TO RELATED APPLICATION

This application claims the benefit under 35 U.S.C. §119 of Japanese Patent Application No. 2008-115241, filed on Apr. 25, 2008, which is hereby incorporated by reference herein in its entirety.

FIELD OF THE INVENTION

The present invention relates to instruction inputting devices of a static capacitance type for detecting, by a change in floating capacitance of an electrode that is formed on the input operation surface, an input operation of an object to be detected, such as a finger on a hemispherical input operation surface, and more specifically, relates to an instruction inputting device for detecting an input operation of an XY direction and a rotational direction into a hemispherical input operation surface with few detection electrodes.

BACKGROUND OF THE INVENTION

The trackball device, wherein a ball is rotated with a finger and the direction of rotation of the ball serves as the input operation direction and the direction of rotation, is known as an input device for movement operations for cursors or characters that are displayed on a display of a computer or a game machine, or the like; however, the ball requires an installation space commensurate with the diameter of the ball, becoming a hindrance to miniaturization of computers and game machines.

Given this, Japanese Unexamined Patent Application Publication 2004-94450 (Patent Reference 1) and Japanese Unexamined Patent Application Publication 2003-91360 (Patent Reference 2) each disclose an instruction inputting device having detection electrodes for detecting floating capacitance that are disposed on the surface of a spherical insulator, and the input operation on a hemispheric input operation surface of the spherical insulator is detected according to a change in the floating capacitance of the detection electrodes.

FIG. 8 is an oblique assembly diagram of a conventional instruction inputting device 100 as described in Patent Reference 2, wherein a plurality of electrodes 101*a* are each disposed in parallel on the top surface side of a top substrate 101 made from a dielectric material, and a plurality of electrodes 102*a* are each disposed in parallel in the direction that is perpendicular to the electrodes 101*a*, on the top surface side of a bottom substrate 102. At the center of both of the top substrate 101 and the bottom substrate 102, protruding curved surface portions, curved upwards in the figure, are formed for each of the substrates 101, 102, together forming an input operation surface with a protruding curved surface wherein the two are stacked.

Each of the electrodes 101*a* and 102*a* is electrically connected to a control circuit 103, where the change in electrostatic capacitance between intersecting ones of the electrodes 101*a* and 102*a* at a point of the input operation, caused by an input operation wherein a finger is brought into proximity with the input operation surface, is detected by the control circuit 103, to output the input operation position. For example, a predetermined pulse voltage is applied by the control circuit 103 to the plurality of electrodes 101*a* and scanned sequentially, and the voltages of the plurality of electrodes 102*a* that intersect with the electrode 101*a* to which the pulse voltage is applied are detected. If a finger or another object to be detected is in proximity, then there will be a change in the static capacitance between the specific electrodes 101*a* and 102*a* that intersect at the position that is in proximity with the object to be detected, and the position of the operation of the object to be detected on the hemispherical input operation surface is detected from the positions of the electrode 102*a* wherein there was the change in voltage due to a change in the static capacitance, and the position of the electrode 101*a* to which the pulse voltage was applied at that time.

In this way, with the conventional instruction inputting device 100 having pluralities of electrodes 101*a* and 102*a* laid out in the form of a matrix, there is a problem in that the circuit structure is complex and large because a change in voltage of a large number of electrodes 102*a* that intersect with each of the electrodes 101*a* to which a detection voltage has been applied must each be sequentially tested in order to detect the position of the input operation on the input operation surface Furthermore, because the position of the input operation is detected by reading the change in voltage for all of the positions of intersections of the large number of electrodes 101*a* and 101*b*, the detection of the position of the input operation is time-consuming, and when detecting the direction of operation and the direction of rotation of operation of an input operation from the relative change in the position of the input operation, the detection time period is long, so the spacing between the operation positions that are detected will be large, making it impossible to detect these directions of operation with high accuracy.

In particular, when detecting a rotational operation wherein the position of the input operation is rotated along a hemispherical input operation surface, the position of the input operation that is detected as a planar coordinate is detected periodically, and the direction of rotation of operation and speed of rotational operation are calculated from the relative positions and direction of the positions of the input operations that have been detected. The calculations are complex, and the detections are time-consuming.

SUMMARY OF THE INVENTION

The present invention is the result of contemplation on the problems with the conventional technology as set forth above, and the object thereof is to provide an instruction inputting device wherein it is possible to detect, using a simple structure having only four electrodes, input operations in both the XY planner correction and the rotational operation direction on a hemispherical input operation surface.

In order to achieve the object set forth above, an instruction inputting device according to a first embodiment of the present invention comprises:

an insulating spherical crown unit formed into the shape of a spherical crown with the apex above the Z axis of an imaginary sphere with the center thereof at the intersection of mutually orthogonal X-, Y-, and Z-axes;

an X+ electrode formed in the shape of a strip along the circumferential direction around the Z axis on the hemisphere on one X direction side of the spherical crown unit, having a plurality of X+ branch patterns that intersect an X+ arc that extends continuously from the apex to a base circle of the insulating spherical crown unit along the one X direction, wherein the widths of the strip shape intersecting the X+ arc are gradually reduced in a direction moving towards the apex from the base circle;

an X− electrode formed in the shape of a strip along the circumferential direction around the Z axis on the hemisphere on the other X direction side of the spherical crown unit, having a plurality of X− branch patterns that intersect an X− arc that extends continuously from the apex to a base circle of the insulating spherical crown unit along the other X direction, wherein the widths of intersections of the strip shapes with the X− arc are gradually reduced in a direction moving towards the apex from the base circle;

a Y+ electrode formed in the shape of the strip along the circumferential direction around the Z axis on the hemisphere on one Y direction side of the spherical crown unit, having a plurality of Y+ branch patterns that intersect an Y+ arc that extends continuously from the apex to a base circle of the insulating spherical crown unit along the one Y direction, wherein the widths of intersections of the strip shapes with the Y+ arc are gradually reduced in a direction moving towards the apex from the base circle;

a Y− electrode formed in the shape of the strip along the circumferential direction around the Z axis on the hemisphere on the other Y direction side of the spherical crown unit, having a plurality of Y− branch patterns that intersect an Y− arc that extends continuously from the apex to a base circle of the insulating spherical crown unit along the other Y direction, wherein the widths of intersections of the strip shapes with the Y− arc are gradually reduced in a direction moving towards the apex from the base circle; and floating capacitance detecting means for detecting, respectively, changes in the floating capacitance of each of the X+ electrode, X− electrode, Y+ electrode, and Y− electrode; wherein each individual detection electrode branch pattern is formed narrowing from a center of the pattern towards both sides in the circumferential direction around the Z axis from the position of intersection with the great circle in the X direction or the Y direction that passes through the apex so that adjacent detecting electrodes do not overlap on the spherical surface; and when there is an input operation is performed that brings an object to be detected into proximity with the spherical crown unit, the direction of the operation in the X-Y plane of the object to be detected is detected from the change in the floating capacitance of the X+ electrode and X− electrode and the change in the floating capacitance of the Y+ electrode and Y− electrode, and the direction of rotational operation around the Z axis of the object to be detected is detected from the changes in the floating capacitances of one of the detecting electrodes and an adjacent detecting electrode in the group consisting of the X+ electrode, X− electrode, Y+ electrode, and the Y− electrode.

The X+ electrode and the X− electrode are formed on one side surface and the other side surface, in the X direction, of the spherical crown unit, wherein each of the X+ branch pattern and the X− branch pattern of the respective electrodes have a largest surface areas near the base circle, which is at a position furthest from the electrode on the opposite side, and are smaller nearing the apex of the spherical crown unit, which is the boundary between the two electrodes. Additionally, the Y+ electrode and the Y− electrode are formed on one side surface and the other side surface, in the Y direction, of the spherical crown unit, wherein each of the Y+ branch pattern and the Y− branch pattern of the respective electrodes have a largest surface area near the base circle, which is at a position furthest from the electrode on the opposite side, and are smaller nearing the apex of the spherical crown unit, which is the boundary between the two electrodes. Because the floating capacitance of each detection electrode, having this branch pattern, increases according to the proximity, to the spherical crown unit, of the object to be detected and according the surface area of the branch pattern facing the object to be detected, when there is an input operation from one side in the X direction to the other side in the X direction, the floating capacitance of the X+ electrode will gradually be reduced and the floating capacitance of the X− electrode will gradually be increased, and when there is an input operation from the other side, in the X direction, to the first side in the X direction, then the increase and decrease in the floating capacitance will be reversed. Similarly, when there is an input operation from one side in the Y direction to the other side in the Y direction, the floating capacitance of the Y+ electrode will gradually be reduced and the floating capacitance of the Y− electrode will gradually be increased, and when there is an input operation from the other side, in the Y direction, to the first side in the Y direction, then the increase and decrease in the floating capacitance will be reversed. Additionally, it is possible to determine the direction of the position of operation around the Z axis from the position of the one detection electrode or a pair of adjacent detecting electrodes wherein the floating capacitance has changed, making it possible to detect the direction of the input operation on the X-Y plane.

The X+ electrode X+ branch pattern and the X− electrode X− branch pattern have the largest surface areas at the point of intersection with the great circle that passes through the apex in the X direction, and the surface areas are smaller around the Z axis the closer to the great circle that passes through the apex in the Y direction. The Y+ electrode Y+ branch pattern and the Y− electrode Y− branch pattern have the largest surface areas at the point of intersection with the great circle that passes through the apex in the Y direction, and the surface areas are smaller around the Z axis the closer to the great circle that passes through the apex in the X direction. When the object to be detected is in proximity to the spherical crown unit, the floating capacitance of the detection electrode of the branch pattern increases depending on the surface area of the branch pattern facing the object to be detected, so in an input operation wherein the object to be detected moves around the Z axis, the floating capacitance of one of the adjacent detection electrodes increases, and the floating capacitance of another one decreases. Consequently, it is possible to detect, from the X+ electrode, X− electrode, Y+ electrode, and Y− electrode, the direction of the input operation around the Z axis from the changes in the floating capacitances in the pairs of adjacent detection electrodes around the Z axis.

The instruction inputting device may detect the position of the rotational operation of the object to be detected around the Z axis by comparing the floating capacitances of adjacent detection electrodes wherein the floating capacitances of the X+ electrode, X− electrode, Y+ electrode, or Y− electrode changes when there is an input operation with the object to be detected into proximity to the spherical crown unit.

Each of the detection electrode branch patterns is formed to be narrower towards both sides of the pattern in the circumferential direction around the Z axis from a position of intersection with the great circle that passes through the apex in the X direction or the Y direction, so as to not overlap the adjacent detection electrode on the spherical surface. Thus, in the individual floating capacitances of adjacent detection electrodes at the position of the operation wherein the object to be detected has been brought into proximity, one floating capacitance will increase and the other will decrease depending on the change of the position of the rotational operation around the Z axis. Consequently, it is possible to detect the position of the rotational operation of the object to be detected around the Z axis from the difference in the floating capacitances of adjacent detection electrodes wherein the floating capacitances change.

In the instruction inputting device as set forth herein, each of the individual detection electrode branch patterns may form the surface of the spherical crown unit that is partitioned by a spherical zone of the width of the intersection wherein the branch pattern intersects with a great circle into a shape that is the complement of the branch pattern of the adjacent detection electrode.

Each of the detection electrode branch patterns is formed so as to be narrowing towards the adjacent detection electrode along the circumferential direction around the Z axis, and so the surface of the spherical crown unit, partitioned into a zone of the width of the intersection, may be formed into a complement by the adjacent detection electrode branch pattern, making it possible to obtain a surface area that is large enough to be able to detect a change in the floating capacitance, within the limited surface of the spherical crown unit, without the two contacting each other.

In the instruction inputting device as set forth herein, each detection electrode branch pattern may be formed to have point symmetry, in regards to the apex, around the apex.

When the object to be detected is brought into proximity with the apex, the surface areas of the X+ branch pattern and X− branch pattern, and Y+ branch pattern and the Y− branch pattern facing the object to be detected are all equal, making it possible to detect the input operation on the apex from the equal increases in the floating capacitances of the X+ electrode and X− electrode, and the floating capacitances of the Y+ electrode and Y− electrode.

In the instruction inputting device as set forth herein, the floating capacitance detecting means may be provided with a CV converting circuit for converting the floating capacitances of each of the detection electrodes into voltage values, where the direction of the rotational operation and speed of the rotational operation of the object to be detected around the Z axis is detected from the change in the output voltages from the CV converting circuit.

Because the floating capacitances of each of the detection electrodes are converted into voltages by the CV converting circuit, the changes in the floating capacitances can be detected quantitatively, and converted to a binary form by an A/D converter for detecting the direction of the rotational operation and the speed of the rotational operation of the object to be detected around the Z axis by a calculating means, such as a microcontroller.

Each of the detection electrodes, that is, the X+ electrode, X− electrode, Y+ electrode, and Y− electrode, has a plurality of branch patterns that branch from each, making it possible to layout the detection electrodes without gaps over the entirety of the surface of the insulating spherical crown unit that is the input operation surface, making it possible to detect the direction of an input operation with excellent precision, from the change in the electrostatic capacitance of the branch pattern that faces the object to be detected, regardless of the position on the surface of the spherical crown unit to which the object to be detected is proximate.

Furthermore, it is possible to detect the direction of operation on the XY plane, and the direction of rotational operation around the Z axis by detecting only the change in the electrostatic capacitances of the four detection electrodes, those being the X+ electrode, X− electrode, Y+ electrode, and Y− electrode.

Additionally, because it is possible to detect the direction of the input operation by merely comparing the changes in the electrostatic capacitances of the four detection electrodes, it is possible to detect the direction of the input operation in a short period of time using a simple structure, without applying alternating current voltages to the electrodes.

In addition, it is possible to detect the position of rotational operation around the Z axis by merely comparing the electrostatic capacitances of two adjacent detection electrodes from the X+ electrode, X− electrode, Y+ electrode, and Y− electrode, and it is also possible to detect the speed of the rotational operation by comparing the positions of the rotational operations over a predetermined elapsed time period.

It is also possible to form a pair of adjacent branch patterns, around the Z axis, without mutually overlapping these patterns, so as to form a large surface area, without wasting the limited spherical crown unit surface, and thus possible to detect with greater precision the increase in floating capacitance due to the proximity of the object to be detected.

Further, it is possible to detect an input operation on to the apex from the increase in all of the floating capacitances of the X+ electrode and X− electrode and the floating capacitances of the Y+ electrode and Y− electrode, and thus it is possible to have the same effect as a button switch for ON and OFF inputs, doing so with no contact, by bringing an object to be detected, such as a finger, into proximity with the apex.

Finally, it is possible to detect the changes in the floating capacitances of each of the detection electrodes quantitatively, as changes in voltage values, making it possible to perform the detection of the position of the input operation and the position of the rotational input operation easily and quickly using a calculating means such as a microcontroller.

BRIEF DESCRIPTION OF THE DRAWINGS

The invention will become more readily apparent from the Detailed Description of the Invention, which proceeds with reference to the drawings, in which:

FIG. 6(*b*) provides a waveform diagram of the relationships between the position of the input operation along the X+ direction and the X− direction and the voltage Vx+ and the voltage Vx−;

FIG. 6(*c*) provides a waveform diagram of the relationships between the position of the input operation along the Y+ direction and the Y− direction and the voltage Vy+ and the voltage Vy−;

DETAILED DESCRIPTION OF THE INVENTION

Figure 1:
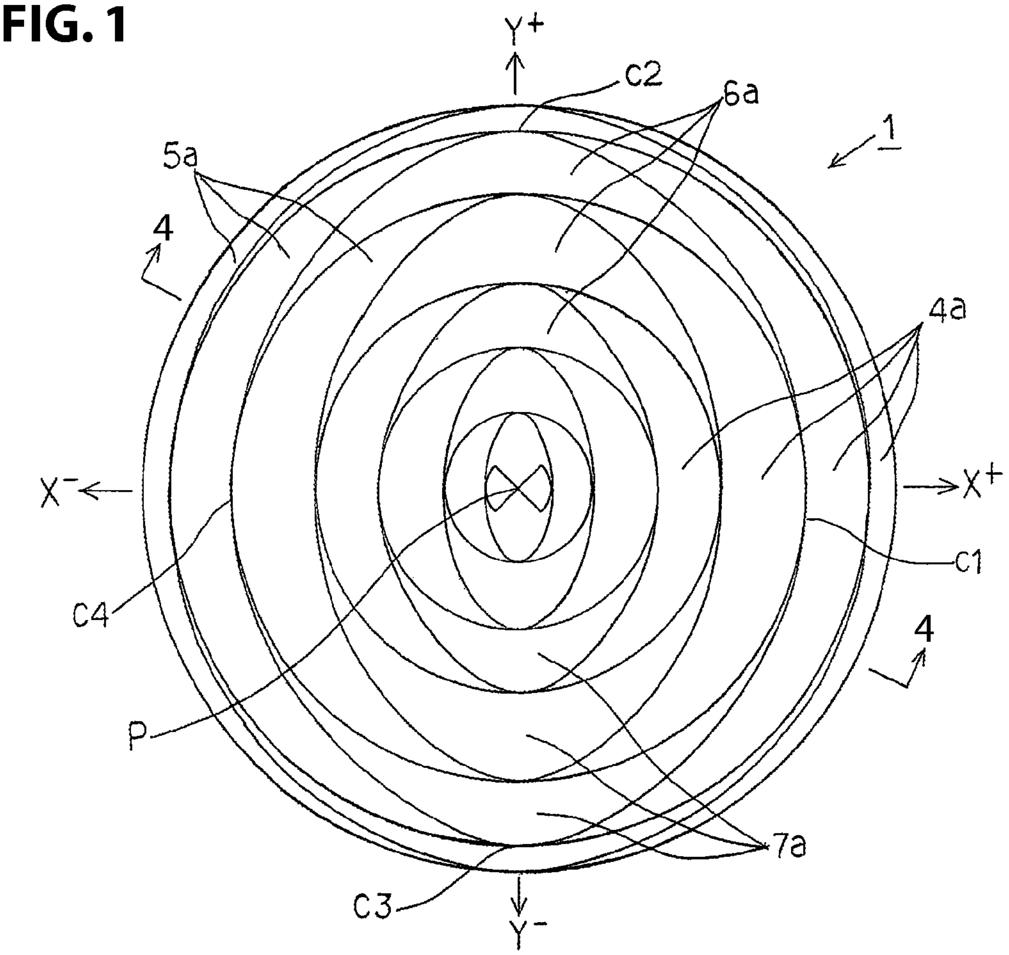
FIG. 1 provides a plan view of an instruction inputting device according to the present invention.

A listing of some of the reference numerals and letters that are used in the drawings, together with descriptions of the corresponding elements, is provided below:

1. Instruction Inputting Device

2. Spherical Crown Unit

4. X+ Electrode

4*a*. X+ Branch Pattern

5. X− Electrode

5*a*. X− Branch Pattern

6. Y+ Electrode

6*a*. Y+ Branch Pattern

7. Y− Electrode

7*a*. Y− Branch Pattern

21. Floating Capacitance Detecting Means (C/E Converting Circuit)

B. Spherical Zone

P. Apex

An exemplary instruction inputting device 1 according to the present invention will be explained below with reference to FIG. 1 through FIG. 7.

The instruction inputting device 1 includes an input operating portion 10 for performing the input operation through bringing a finger, which is the object to be detected, into proximity, and an input operation detecting circuit portion 20 for detecting input operations in the planar direction and in the rotational direction relative to the input operating portion 10. The input operating portion 10 comprises a spherical crown unit 2 having a surface that is formed into a spherical crown shape, a X+ electrode 4, a X− electrode 5, a Y+ electrode 6, and a Y− electrode 7, which are formed from a conductive material, such as silver, on the surface of the spherical crown unit 2, and which are mutually insulated from each other, and a cover sheet 8 that covers the surface in order to protect each of the detection electrodes.

Figure 2:
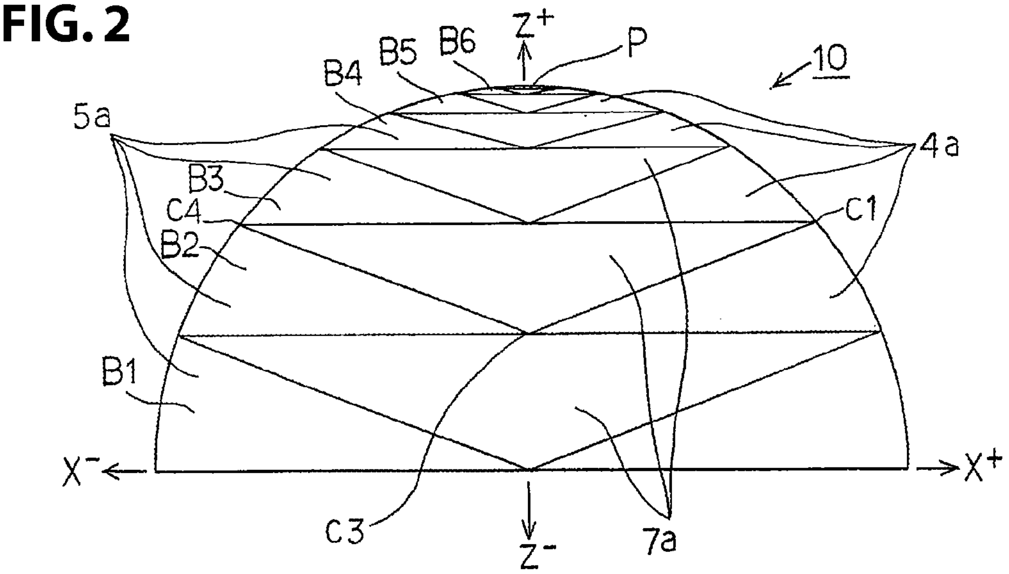
FIG. 2 provides a front view of the instruction inputting device of FIG. 1.
Figure 3:
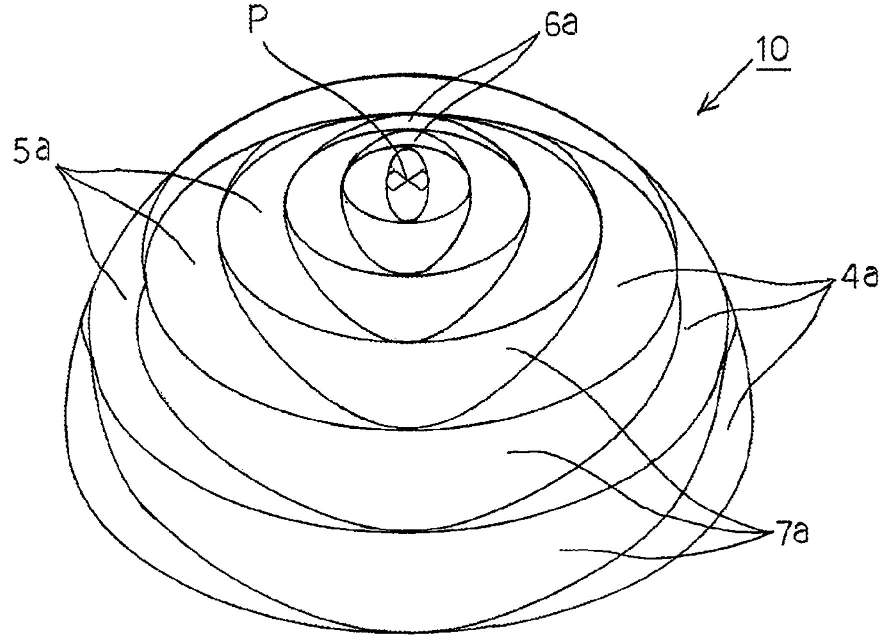
FIG. 3 provides an oblique view of the instruction inputting device of FIG. 1.
Figure 4:
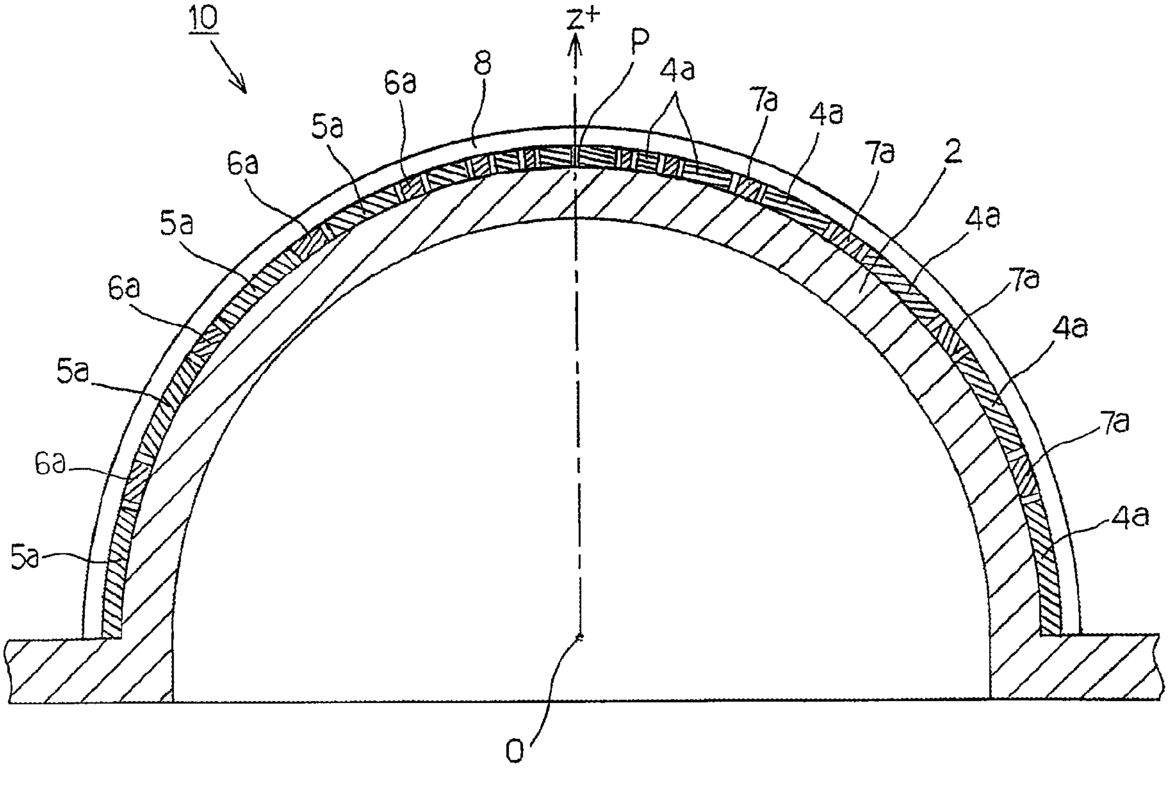
FIG. 4 provides a lateral cross-sectional view of the instruction inputting device of FIG. 1.

The spherical crown unit 2 is formed from an insulating plastic material so that the surface thereof will have a spherical crown shape with a diameter for example of approximately 20 mm, so that when the instruction inputting device 1 is attached to the case of a personal computer, a game machine, or the like, with the instruction inputting device 1 as the instruction inputting device for the personal computer, game machine, or the like, the spherical crown unit 2 can be fabricated integrally with the case, from the same material. In the present example of embodiment, in an imaginary sphere wherein the intersection of the mutually orthogonal X, Y, and Z axes is defined as the spherical center O, the Z+ direction (the vertical upper direction) extends to apex point P, the hemispherical surface wherein the base circle is the great circle is defined as the surface, and spatial hemispheres are formed with equal thicknesses along the hemispherical surface. As shown in FIG. 1, the direction to the right from the apex P is defined as the X+ direction, the direction downward from the apex P is defined as the Y− direction, the direction to the left from the apex P is defined as the X− direction, and the direction upwards from the apex P is defined as the Y+ direction. As shown in FIG. 2, the upward direction is defined as the Z+ direction, the downward direction is defined as the Z− direction, the arc that is continuous from the apex P to the base circle in the X+ direction along the spherical surface of the spherical crown unit 2 is defined as the X+ arc, the arc that is continuous from the apex P to the base circle in the Y− direction is defined as the Y− arc, the arc that is continuous from the apex P to the base circle in the X− direction is defined as the X− arc, and the arc that is continuous from the apex P to the base circle in the Y+ direction is defined as the Y+ arc, where the circumferential direction around the Z axis, which is perpendicular to all of these arcs, is defined as the circumferential direction in the explanations of the various components below.

The X+ electrode 4 is structured from a plurality of X+ branch patterns 4*a*, 4*a*, . . . , that connect along the X+ arc on the hemispherical surface in the X+ direction from the apex P of the spherical crown unit 2, and an X+ lead pattern 4*b* that leads from the bottommost X+ branch pattern 4*a* to the input operation detecting circuit portion 20. Each of the plurality of X+ branch patterns 4*a*, 4*a*, . . . is formed in a strip shape along the circumferential direction, intersecting at a center of the pattern with the X+ arc. Furthermore, the widths of intersections of the plurality of X+ branch patterns 4*a*, 4*a*, . . . with the X+ arc not only gradually become smaller towards the apex P from the base circle, but also each X+ branch pattern 4*a* is formed into a bow shape that narrows towards both ends, in the circumferential direction, from the position of the intersection, with the maximum width being the width of the intersection at the position of the intersection with the X+ arc.

In the present example of embodiment, the plurality of X+ branch patterns 4*a*, 4*a*, . . . , are formed with this type of shape for each of the individual X+ branch patterns 4*a* in individual spherical zones B1 through B6 wherein the spherical surface of the spherical crown unit 2 is partitioned by pairs of XY planes with the spacing in the Z direction therebetween gradually decreasing from the spherical center 0 towards the apex P. Consequently, the widths of each of the spherical zones B1 through B6 is gradually decreased, where, for example, the widths of the largest spherical zone B1 may be 3 mm, and the width of the smallest spherical zone B6 may be 1 mm.

As is illustrated in FIG. 1 and FIG. 2, when the intersection of the X+ arc and the top circle of the spherical zone B wherein the X+ branch pattern 4*a* is formed is defined as c1, and the positions that are rotated 90° around the apex P, on the bottom circle of the spherical zones B, or in other words, the intersections of the bottom circle with the Y+ arc and the Y− arc are defined as c2 and c3, and the line segments along the spherical surface that connect between these three points c1, c2, and c3 are defined as boundary lines, then each of the X+ branch patterns 4*a* is formed on the surface of the spherical zone B with a shape having a contour similar to the contour of the X+ branch pattern 4*a* positioned inside of these boundary lines In this way, with the spherical crown unit 2 wherein the plurality of X+ branch patterns 4*a*, 4*a*, . . . , is formed on the individual spherical zones B1 through B6, the surface area of the X+ branch pattern 4*a* is at a maximum in the X+ direction with the apex P at the rotational center of the pattern, and decreases when rotated from the X+ direction, with the base circle side being a maximum, and the nearer to the apex P, or in other words, the further the movement to the X− direction, with the base circle side in the X+ direction being the maximum, the less the surface area.

The Y− electrode 7 is structured from a plurality of Y− branch patterns 7*a*, 7*a*, . . . , that connect along the Y− arc on the hemispherical surface in the Y− direction from the apex P of the spherical crown unit 2, and a Y− lead pattern 7*b* that leads from the bottommost Y− branch pattern 7*a* to the input operation detecting circuit portion 20. Each of the plurality of Y− branch patterns 7*a*, a, . . . is also formed in a strip shape along the circumferential direction, intersecting with the Y− arc at different positions, where the widths of these intersections not only gradually become smaller towards the apex P from the base circle, but also each Y− branch pattern 7*a* is formed into a bow shape that narrows towards both ends, in the circumferential direction, from the position of the intersection, with the maximum width being the width of the intersection at the position of the intersection of the branch patter with the Y− arc.

In the present example of embodiment, if, as is illustrated in FIG. 1 and FIG. 2, the intersection between the bottom circle of the zone B wherein the Y− branch pattern 7*a* is formed and the intersection of the bottom circle with the Y-arc is defined as c3, and the intersections wherein the top circle of the spherical zone B intersects with the X+ arc and the X− arc are defined as c1 and c4, and the line segments along the spherical surface that connect between these three points c3, c1, and c4 are defined as boundary lines, then each of the plurality of Y− branch patterns 7*a* is formed on the surface of the spherical zone B with a shape having a contour similar to the contour of the Y− branch pattern 7*a* positioned inside of these boundary lines.

Consequently, the surface areas of the Y− branch patterns 7*a*, 7*a*, . . . , on the surface of the spherical crown unit 2 is at a maximum in the Y− direction, with the apex P at the center of rotation of the pattern, and decreases when rotated from the Y− direction, with the base circle side in the Y− direction being a maximum, with the surface area decreasing the further the movement in the Y+ direction.

The X− electrode 5 is structured from a plurality of X− branch patterns 5*a*, 5*a*, . . . , that connect along the X− arc on the hemispherical surface in the X− direction from the apex P of the spherical crown unit 2, and a X− lead pattern 5*b* that leads from the bottommost X− branch pattern 5*a* to the input operation detecting circuit portion 20. The plurality of X− branch patterns 5*a*, 5*a*, . . . is formed on the X− side of the spherical surface of the spherical crown unit 2 in a shape that has point symmetry, with respect to the apex P, relative to the plurality of X+ branch patterns 4*a*, 4*a* . . . of the X+ electrode 4. Consequently, the surface areas of the X− branch patterns is at a maximum in the X− direction, with the apex P at the rotational center of the pattern, and decreases when rotated from the X− direction, with the base circle side in the X− direction being a maximum, with the surface area decreasing the further the movement in the X+ direction.

The Y+ electrode 6 is structured from a plurality of Y+ branch patterns 6*a*, 6*a*, . . . , that connect along the Y+ arc on the hemispherical surface in the Y+ direction from the apex P of the spherical crown unit 2, and a Y+ lead pattern 6*b* that leads from the bottommost Y+ branch pattern 6*a* to the input operation detecting circuit portion 20. The plurality of Y+ branch patterns 6*a*, 6*a*, . . . is formed on the Y+ side of the spherical surface of the spherical crown unit 2 in a shape that has point symmetry, with respect to the apex P, relative to the plurality of Y− branch patterns 7*a*, 7*a* . . . of the X+ electrode 7. Consequently, the surface areas of the Y+ branch patterns is at a maximum in the Y+ direction, with the apex P at the rotational center of the pattern, and decreases when rotated from the Y+ direction, with the base circle side in the Y+ direction being a maximum, with the surface area decreasing the further the movement in the Y− direction.

As described above, the individual branch patterns 4*a*, 5*a*, 6*a*, and 7*a* of the X+ electrode 4, the X− electrode 5, the Y+ electrode 6, and the Y− electrode 7, formed on the spherical surface of the spherical crown unit 2, each interleave with the branch patterns 4*a*, 5*a*, 6*a*, and 7*a* that are adjacent in the circumferential direction, forming the spherical surface of the spherical zone B into complementary shapes, without overlapping each other, thus making it possible to form branch patterns 4*a*, 5*a*, 6*a*, and 7*a* with large surface areas, without wasting the limited surface area of the spherical surface of the spherical crown unit 2, making it possible to detect the increase in the floating capacitance, due to the proximity of the object to be detected, with greater precision.

On the other hand, if it is not possible to identify clearly the change in the floating capacitance when the finger, which is the object to be detected, is facing a plurality of spherical zones B even though the surface areas of the individual branch patterns are different because the widths of the individual spherical zones B are different, the gap between branch patterns may be bridged by the surface of the spherical crown unit 2, which is an insulator, through, for example, interposing a spherical zone B that does not have branch patterns formed thereon.

The cover sheet 8 that covers the surface in order to protect the X+ electrode 4, the X− electrode 5, the Y+ electrode 6, and the Y− electrode 7 may be formed out of a thin sheet of a polyester resin such as polyethylene terephthalate (PET) or polyimide. The cover sheet 8 does not necessarily need to be transparent, and can be given a variety of colors and patterns matching the case, or the like, wherein the instruction inputting device 1 is installed. The surface of the cover sheet 8 serves as the input operation surface whereon the finger, which is the object to be detected, is brought into proximity, or into contact, and dragged.

Figure 5:
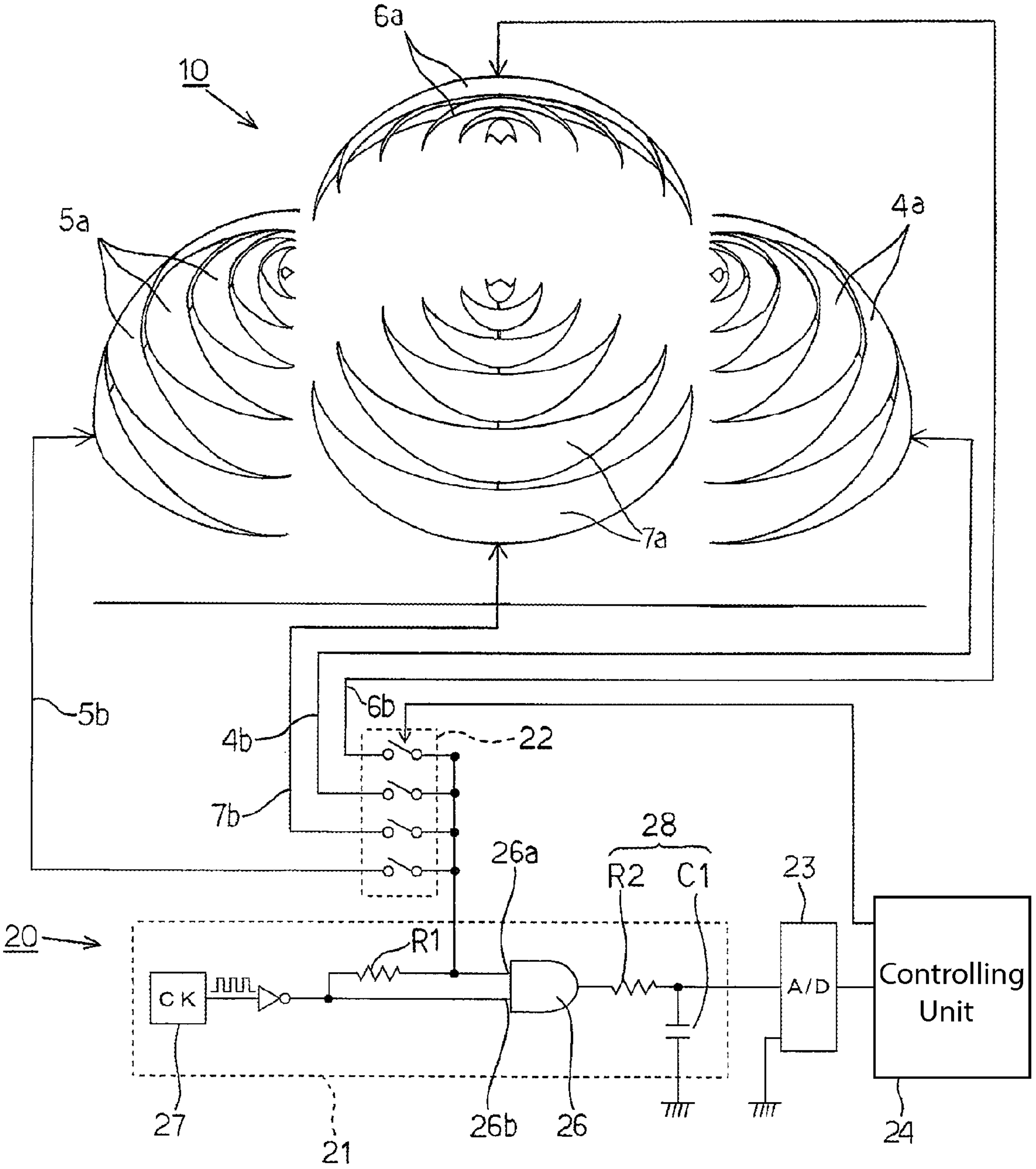
FIG. 5 provides a circuit structure diagram of the instruction inputting device of FIG. 1.

As illustrated in FIG. 5, the input operation detecting circuit portion 20, which detects the position of the input operation into the input operating portion 10, has a capacitance-to-voltage (CV) converting circuit 21 for converting electrostatic capacitance into a voltage, a switch 22 that selectively switches to any of the lead patterns 4*b*, 5*b*, 6*b*, or 7*b* of the X+ electrode 4, the X− electrode 5, the Y+ electrode 6, or the Y− electrode 7, to connect to the CV converting circuit 21, an A/D converter 23 for producing a digital signal based on a signal output by the CV converting circuit 21, and a controlling portion 24 that is connected to the output of the A/D converter 23.

The CV converting circuit 21 includes an AND gate 26, with one input 26*a* thereof being connected to a resistance R1 that forms a delay circuit, an oscillating circuit 57 for outputting a clock signal having a square wave of a predetermined period to the other input 26*b* of the AND gate 26, on the side opposite from the resistance R1, and a smoothing circuit 28, comprising a resistance R2 and a capacitor C1.

Moreover, a common terminal of the switch 22, may be interconnected via four switching elements respectively connected to the individual lead patterns 4*b*, 5*b*, 6*b*, and 7*b*, is further connected between the resistance R1 and the input 26*a* of the AND gate 26. This forms a delay circuit, by the resistance R1, with the electrostatic capacitance of the individual detection electrode that is connected to the switch 22, that is, the X+ electrode 4, the X− electrode 5, the Y+ electrode 6, or the Y− electrode 7, where a clock signal that is delayed depending on the electrostatic capacitance of the detection electrode is inputted into the input 26*a* of the AND gate 26. That is, a clock signal is inputted into the one input 26*a* of the AND gate 26 with a delay that is proportional to the electrostatic capacitance of the detection electrode, while a clock signal that is not delayed is inputted into the other input 26*b*, so the AND gate 26 outputs a pulse signal wherein the pulse width has been shortened depending on the electrostatic capacitance of the detection electrode, with the maximum width being the pulse width of the clock signal.

The output of the AND gate 26 is smoothed by the smoothing circuit 28, and a voltage V that is dependent on the pulse width is outputted to the A/D converter 23. The A/D converter 23 outputs, to the controlling circuit 24, as digital data that can be handled by the controlling circuit 24, which comprises a CPU or the like, the output voltage V of the smoothing circuit 28, which represents the electrostatic capacitance of the detection electrode. The controlling circuit 24 controls the switching of the switch 22, and compares a digital representation of the output voltage V, which is inputted from the A/D converter 23, for each detection electrode to detect the rotational input operation or X or Y-direction movement operation of the object to be detected relative to the input operation surface that is the surface of the spherical crown unit 2.

The operation for detecting a rotational input operation or an X or Y-direction movement operation of the object to be detected by the instruction inputting device 1, structured as set forth above, will be described below. When the object to be detected, for example, a finger, is brought into proximity to the spherical crown unit 2, the floating capacitance of the detection electrode, having the branch pattern, increases proportionately with the surface area of the branch pattern on the surface of the spherical crown unit 2 that faces the finger. In the input operation detecting circuit portion 20, the control circuit 24 performs control so as to switch the common terminal of the switch 22 to the branch patterns 4*a*, 5*a*, 6*a*, and 7*a* of each of the detection electrodes 4, 5, 6, and 7 with a period that is adequately fast for the speed of the input operation, and for each input operation position, inputs, into the controlling circuit 24, the increase or decrease in the floating capacitance of the detection electrode 4, 5, 6, and 7, represented by the digital representation of the voltage V from the A/D converter 23.

The operation for detecting the rotational input operation around the Z axis on the instruction inputting device 1 will be described first. Each of the individual detection electrode branch patterns 4*a*, 5*a*, 6*a*, and 7*a* of the X+ electrode 4, X− electrode 5, Y+ electrode 6, and Y− electrode 7 that are formed on the surface of the spherical crown unit 2 is formed so that the surface area of the patterns increases at points along the X+ direction, X− direction, Y+ direction, or Y− direction, respectively, from the apex P, and decreases at points moving away from the X+ direction, X− direction, Y+ direction, or Y− direction, respectively around the Z axis, so that if, for example, the finger is brought into proximity with the spherical crown unit 2 from the X+ direction, then there would be an increase of a floating capacitance Cx+ from the floating capacitance of the X+ electrode 4.

In this state, when the controlling circuit 24 connects the common terminal of the switch 22 to the X+ lead pattern 4*b*, then a clock signal that is delayed by the resistance R1 and the electrostatic capacitance Cx+ is inputted into the input 26*a* of the AND gate 26. A non-delayed clock signal is inputted into the other input 26*b* of the AND gate 26, so the output of the and circuit 26 will output a pulse signal that is shorter than the clock signal pulse width by the delay time that is increased by the electrostatic capacitance Cx+. The smoothing circuit 28 outputs, to the controlling circuit 24, a voltage Vx+ that is dependent on the pulse width that is outputted from the output of the AND gate 26, through the A/D converter 23, so a digital representation of the voltage Vx that is inputted into the controlling circuit 24 will be a minimum voltage value when the finger is in proximity to the base surface side of the spherical crown unit 2, in the X+ direction, when the electrostatic capacitance Cx+ of the X+ electrode 4 is maximized.

On the other hand, the surface area of the branch patterns 5*a*, 6*a*, and 7*a* of the other detection electrodes that face the finger that has been brought into proximity from the X+ direction are zero or extremely small, so that the clock signals that are inputted into the input terminal 26*a* of the AND gate 26 when the respective lead patterns 5*b*, 6*b*, and 7*b* are sequentially connected to the common terminal of the switch 22 will not be delayed relative to the other input 26*b*, so that a pulse signal that is essentially of the same width as the pulse width of the clock signal will be outputted from the AND gate 26. Consequently, when the electrostatic capacitances Cx−, Cy+, and Cy− of the other detection electrodes 5, 6, and 7 are zero, then the voltages Vx−, V y+, and Vy−, which represent the electrostatic capacitances of the respective detection electrodes 5, 6, and 7, inputted into the controlling circuit 24, will be at the maximum voltage Vmax. That is, the voltage V that is inputted into the controlling circuit 24 will be less when the electrostatic capacitance C of the detection electrode is increased, and when the electrostatic capacitance C falls to 0, then the voltage will be at the maximum voltage Vmax, in a relationship that indicates the increase or decrease in the capacitance of each detection electrode.

Figure 6A:
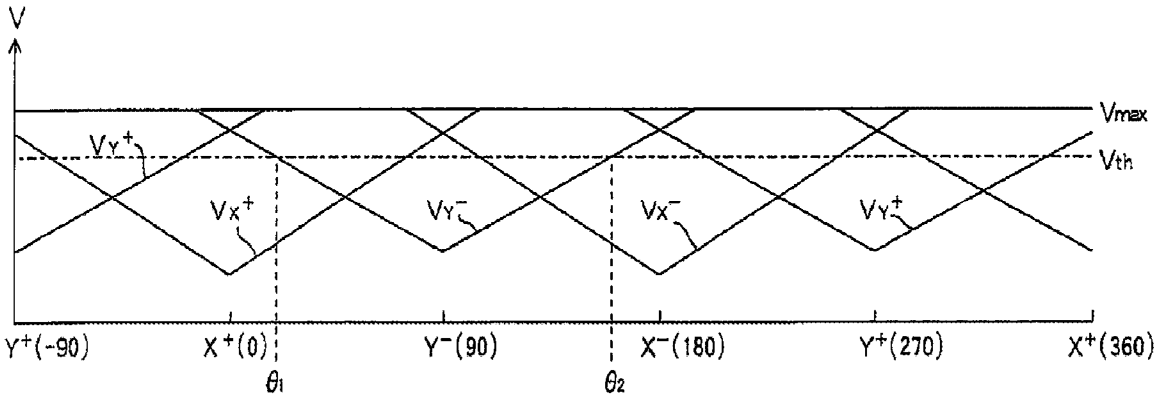
FIG. 6(*a*) provides a waveform diagram of the relationship between the position of the input operation around the Z axis and the voltage V for each of the detection electrodes 4, 5, 6, and 7.
Figure 6B:
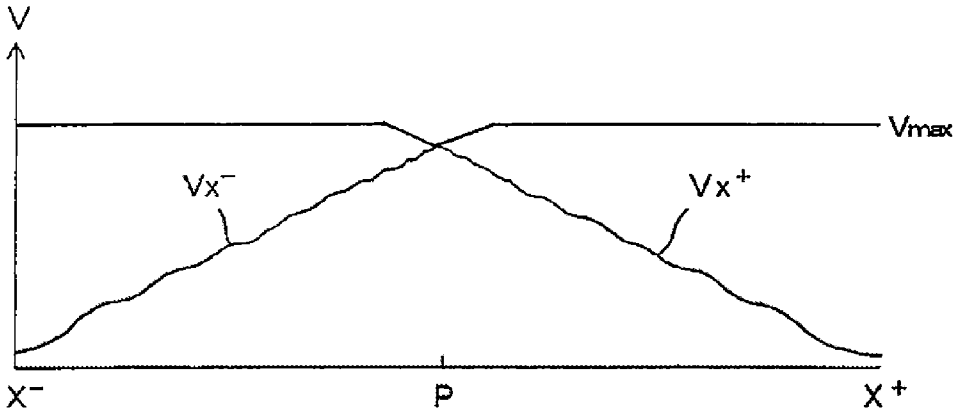
Figure 6C:
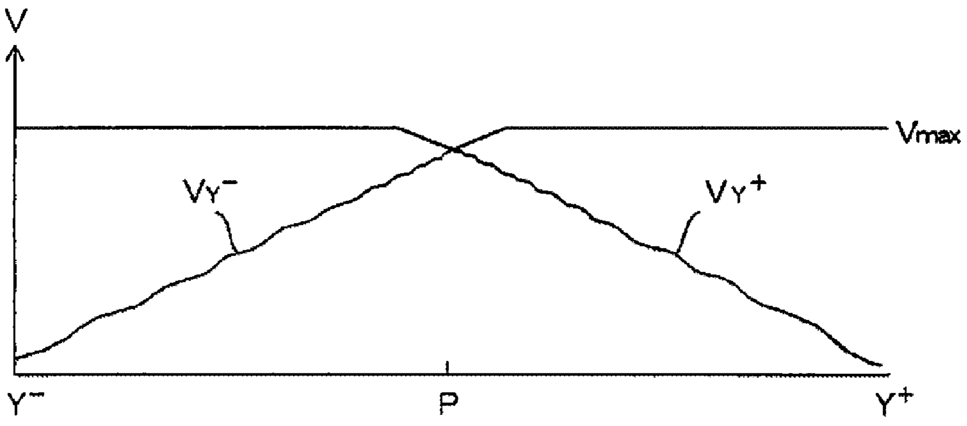
Figure 7:
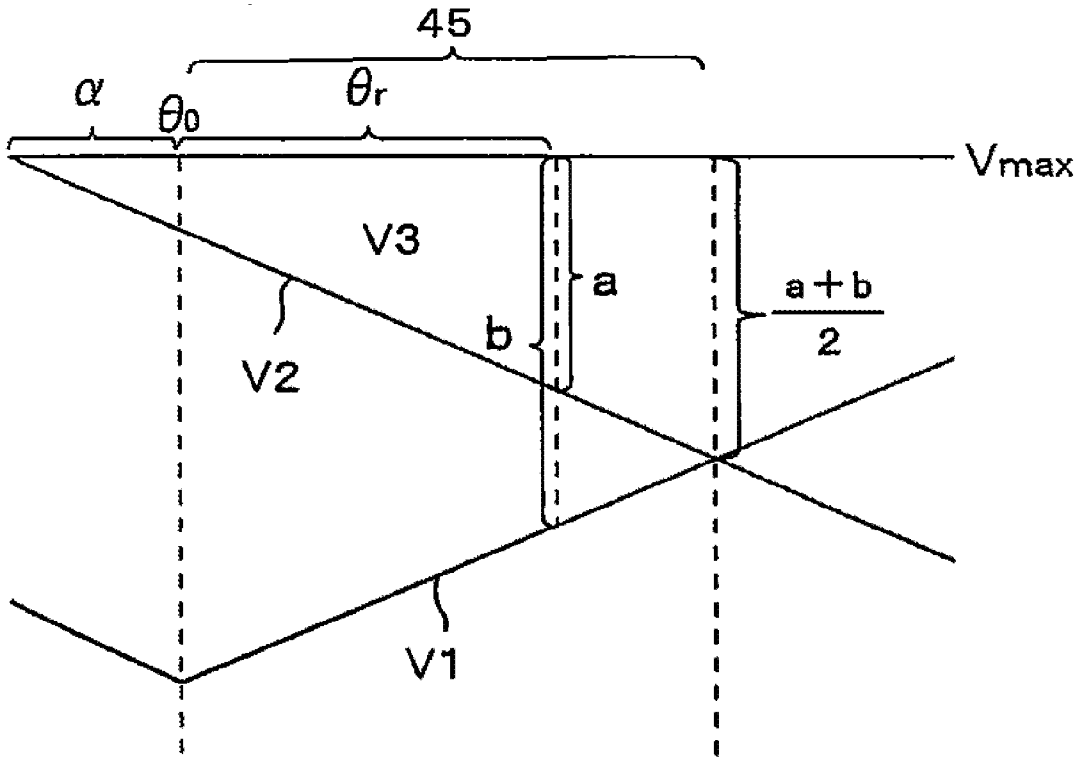
FIG. 7 provides an explanatory diagram illustrating a method for calculating the position of the input operation around the Z axis.
Figure 8:
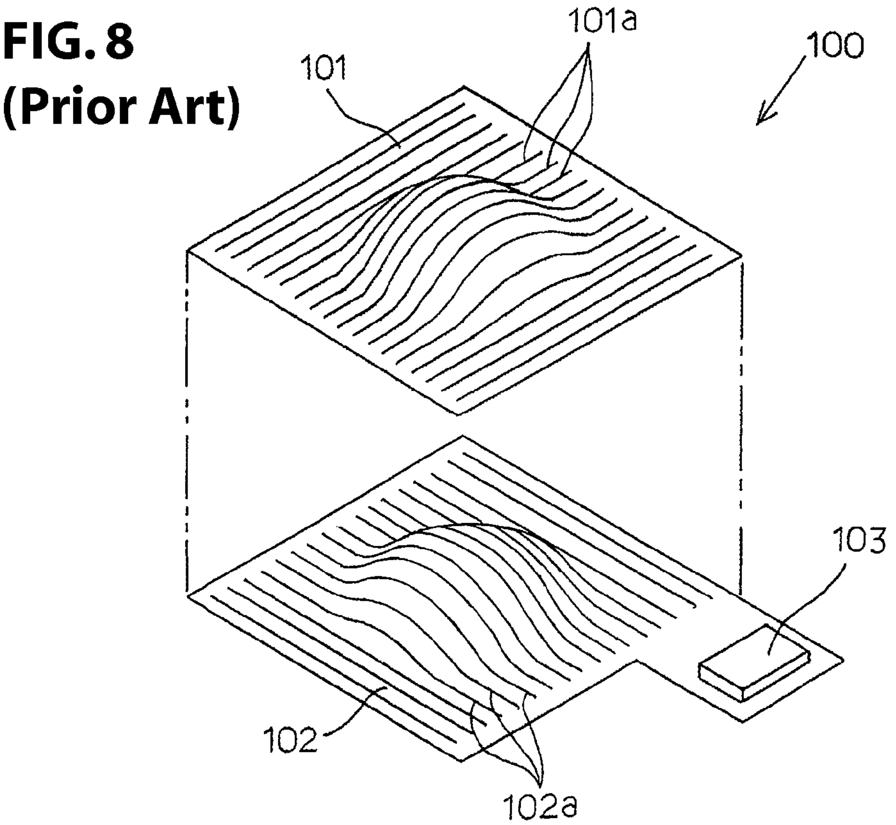
FIG. 8 provides an oblique assembly diagram illustrating a conventional instruction inputting device.

As illustrated in FIG. 6(*a*) when the X direction is defined as 0° around the Z axis and the position of operation of the finger is moved in the clockwise direction, the electrostatic capacitance Cx+ of the X+ electrode 4 gradually decreases, and the electrostatic capacitance Cy− of the Y− electrode 7 gradually increases, and thus the voltage Vx+ that is inputted into the controlling circuit 24 gradually increases, and the voltage Vy− that is inputted into the controlling circuit 24 gradually decreases. At the operation position in the Y− direction, rotated by 90° in the clockwise direction, the electrostatic capacitance Cy− of the Y− electrode 7 reaches a maximum, and the voltage Vy− that is inputted into the controlling circuit 24 for the Y− electrode 7 reaches a minimum value, where, at the same time, the voltage Vx+, for the X+ electrode 4, increases to nearly the maximum value Vmax. Note that the voltage Vx+ will not reach the maximum voltage Vmax at the position of operation in the Y− direction is because a portion of the finger that is in proximity in the Y− direction faces the end portion of the branch pattern 4*a* of the X+ electrode 4.

When the position of operation of the finger is rotated further in the clockwise direction from the Y− direction, then the electrostatic capacitance Cy− for the Y− electrode 7 gradually diminishes, and the electrostatic capacitance Cx− for the X− electrode 5 gradually increases, and at the position of operation in the X− direction, rotated by 180° in the clockwise direction from the X+ direction, the electrostatic capacitance Cx− for the X− electrode 5 reaches a maximum, and the voltage Vx− for the X− electrode 5 reaches a minimum, while, at the same time, the voltage Vy− for the Y− electrode 7 rises to the vicinity of the maximum voltage Vmax. Similarly, with the position of operation of the finger at the Y+ direction, rotated by 270° from the X+ direction, the electrostatic capacitance Cy+ for the Y+ electrode 6 reaches a maximum, and the voltage Vy+ that is inputted into the controlling circuit 24 for the Y+ electrode 7 reaches a minimum, at which time, the voltage Vx− for the X− electrode 5 rises to nearly the maximum voltage Vmax.

In this way, the voltages Vx+, Vx−, Vy+, and Vy− that are inputted into the controlling circuit 24 for each of the detection electrodes 4, 5, 6, and 7 around the Z axis will be voltages that differ depending on the position of operation, as shown in FIG. 6(*a*), so in the controlling circuit 24 it is possible to detect, from these voltages Vx+, Vx−, Vy+, and Vy−, the direction of the operation, around the Z axis, by the finger relative to the spherical crown unit 2 by comparing the voltages for the set of detection electrodes that are adjacent at the position of operation.

In the present exemplary example, a voltage that is lower than the maximum voltage Vmax that is inputted into the control circuit 24 when the electrostatic capacitance of the detection electrode is 0 is defined as a threshold voltage Vth (illustrated by the dotted line in FIG. 6(*a*)), and if the voltage V that is inputted into the controlling circuit 24 for any of the detection electrodes 4, 5, 6, or 7 falls below this threshold voltage Vth, then a detection electrode E1, and a voltage V1 for that detection electrode E1, are produced. When no input operation is performed, then the voltages V that are inputted into the controlling circuit 24 for all of the detection terminals will be at the maximum voltage Vmax, in a state wherein there is no increase in the floating capacitance detecting finger, so that the voltages of V for each of the detection electrodes 4, 5, 6, and 7 will be below the threshold voltage Vth, and thus if any of the voltages V for any of the detection terminals 4, 5, 6, or 7 is less than the threshold voltage Vth, then this is an operation of the finger from the direction at which the detection electrode E1 is disposed. For example, as illustrated in FIG. 6(*a*), when the voltage Vy− that is inputted into the controlling circuit 24 for the Y− electrode 6 is less than the threshold voltage Vth, then it can be understood that the position of the input operation is between θ1 and θ2 around the Z axis.

Following this, the voltages V2 and V3, which are inputted into the controlling circuit 24 by the switching of the switch 22, are compared for the detection electrodes E2 and E3 that are adjacent to the detection electrode E1. One of the voltages V2 or V3 (for example, V3) is a value that is at the maximum voltage Vmax, or in the vicinity thereof, and the lower of the voltages V2 and the detection electrode E2 thereof are detected. In the example described above, the detection electrodes that are adjacent to the Y− electrode 7 are the X+ electrode 4 and the X− electrode 5, where if the position of the input operation has been shifted by θ1 from the Y− direction, then the voltage Vx+ for the X+ electrode 4 will be lower than the voltage Vx− for the X− electrode 5, which will be near to the maximum voltage Vmax, and if shifted by θ2, then the voltage Vx− for the X− electrode 5 will be lower than the voltage Vx+ for the X+ electrode 4, which will be near the maximum voltage Vmax. Here we will assume that the position of the input operation is between the Y− direction and θ2 around the Z axis, so the voltage Vx− of the X− electrode 5 will be lower than the voltage Vx+.

The direction of the input operation around the Z axis (the position of the input operation) is calculated from the difference between the voltage on the lower side of either of the voltages V2 or V3 (for example, V2) and the maximum voltage Vmax, and from the difference between the voltage V1, which is below the threshold voltage Vth, and the maximum voltage Vmax. The method for calculating the position of operation will be explained below using FIG. 7, which is an expanded view of FIG. 6(*a*), assuming that the voltage V for each of the detection electrodes, inputted into the controlling circuit 24, varies with an equal slope around the Z axis. In the figure, the position of operation around the Z axis wherein the voltage V1 is minimized is defined as the reference position θo, the position of the input operation is defined as the position wherein there has been a rotation of θr in the counterclockwise direction from the reference position θo, the difference between the maximum voltage Vmax and the voltage V2 on the low side is defined as a, and the difference between the maximum voltage Vmax and the voltage V1 is defined as b.

The position wherein the voltage V1 and the voltage V2 are equal, or in other words, the position wherein a and b are equal, is essentially in the middle of the adjacent detection electrode E1 and E2 that are disposed around the Z axis with a 90° spacing, so is a position that has been rotated by 45° from the reference position θo, where the voltage V2 on the low side will be at the maximum voltage Vmax at a position that is rotated by α in the opposite direction from the reference position θo, and so given the relationship illustrated in the figure, the following relationship can be derived:

$$\theta r = a(2\alpha + 90)/(a+b) - \alpha \qquad [1]$$

This produces the position of the input operation from the reference position θo wherein the surface area is largest in the detection electrode E1.

Note that when there has been an input operation at a position that is beyond about the center of the adjacent detection electrodes E1 and E2, then the voltage V1 will be higher than the voltage V2 on the low side, but Equation [1] is satisfied even if the center position is passed, making it possible to calculate the position of the input operation from the reference position θo. That is, the voltage V that is initially determined to be below the threshold voltage Vth need not be the lowest voltage of the voltages V that are inputted into the controlling circuit 24 in regards to the other detection voltages, and insofar as the voltage V that is inputted into the controlling circuit 24 is less than the threshold voltage Vth, the position of the input operation can be calculated by the method set forth above for any of the detection electrodes.

Explaining the calculation of the position of the input operation in even more detail, using the example set forth above, in FIG. 6(*a*) there is an input operation at a position between the Y− direction and θ2 around the Z axis, so the voltage Vy− that is inputted into the controlling circuit 24 for the Y− electrode 7, and the voltage Vx− that is inputted for the X− electrode are less than the threshold value Vth. The position of the input operation is between the 90° position of the Y− direction from the X+ direction and the 180° position of the X− direction from the X+ direction, where the angle θr from the Y− direction to the position of the operation can be derived from the following equations where α is, for example, 5°, a is Vmax−Vx−, and b is Vmax−Vy, so from Equation (1):

$$\theta r = 100(V\text{max} - Vx-)/(2\,V\text{max} - (Vx- + Vy-)) - 5 \qquad [2]$$

The controlling circuit 24 calculates the position of the input operation around the Z axis as 100 (Vmax− Vx−)/(2 Vmax−(Vx−+Vy−))+85, calling the X+ direction 0°.

As can be understood from Equation [1], the position of the input operation around the Z axis can be calculated from the ratio of the amounts of changes (a, b) of the floating capacitances for the pair of adjacent detection electrodes that are facing the position of the input operation, and there is no need to calculate the actual amounts of change for the individual detection electrodes. That is, the floating capacitances for the individual detection electrodes are inversely proportional to the square of the distances of the finger from the detection electrodes, and so will vary depending on the distance between the finger and the detection electrode, but the ratio of the surface areas that are facing the finger for the adjacent detection electrodes does not vary with the distance of the finger. Because of this, it is possible to calculate the position of the operation without applying, to the input operation, a limitation such as having an equal distance for the distance between the detection electrodes that face the object to be detected when the finger is brought along the cover 8 that covers the services of the individual detection electrodes 4, 5, 6, and 7. Note that this is conditional upon the voltage V that is inputted into the controlling circuit 24 for an individual detection electrode having a constant slope, depending on the position of the input operation around the Z axis, and so, insofar as is possible, preferably the branch pattern is formed in a bow shape, narrowing on the ends that face in both directions in the circumferential direction from the position of the intersection with the arc of each detection electrode, shaped so that the surface area will change proportionately with the distance in the circumferential direction.

The direction of rotation and the speed of rotation around the Z axis relative to the instruction inputting device 1 can be detected from the relative direction of motion and distance of motion between the positions of the input operations over one cycle by performing these input operation position calculations at predetermined intervals. However, the position of the input operation around the Z axis, as described above, requires the formation of the branch pattern so that the surface area of each of the detection electrodes will change proportionately with the angle of rotation around the Z axis, and time is required to calculate the position of the input operation for each of the predetermined cycles.

On the other hand, when detecting only the direction of a rotational operation and the speed of the rotational operation for the input operation, it is not necessary to calculate the position of the input operation, and it is also not necessary for the surface area of each of the detection electrodes to be precisely proportional to the angle of rotation around the Z axis. Given this, the method for detecting the direction of a rotational operation and the speed of the rotational operation will be described below.

As is illustrated in FIG. 6(*a*) the voltages Vx+, Vx−, V y+, and V y− that are inputted into the controlling circuit 24 for each of the detection electrodes 4, 5, 6, and 7 will assume the minimum voltages at 0°, 180°, 270°, and 90°, respectively, and at a position that is rotated by about 45° from the position of the minimum voltage, will be at a voltage that is equal to the voltage that is inputted from the adjacent detection electrode into the controlling circuit 24. Consequently, it is possible to detect the direction of the rotational operation by comparing the changes in a pair of voltages V for adjacent detection electrodes among the voltages Vx+, Vx−, Vy+, and Vy−. For example, if the voltage Vy− for the Y− electrode 7 has increased and the voltage Vx+ for the X+ electrode 4 that is adjacent to the Y− electrode 7 has decreased, it can be determined that the rotational operation is in the counterclockwise direction in FIG. 1, and if the voltage Vy− for the Y− electrode 7 has increased and the voltage Vx− for the adjacent X− electrode 5 has decreased, it can be determined that the rotational operation is in the clockwise direction.

Additionally, it is possible to detect the position of the input operation, described above, at 0°, 90°, 180°, and 270° by one of the voltages Vx+, Vx−, Vy+, or Vy− reaching the minimum voltage, and from the detection electrode that has reached the minimum voltage, and because the position of the input operation is also detected during that interval around the Z axis from the pair of detection electrodes wherein the voltages will be equal for the pair of adjacent detection electrodes for the voltages Vx+, Vx−, Vy+, and Vy−, it is possible to detect the speed of rotation from the time that elapses between these pairs of positions of input operations.

The method for detecting the direction of the input operation of the object to be detected on the XY plane will be described next. As described above, each of the detection electrode branch patterns 4*a*, 5*a*, 6*a*, and 7*a* of the X+ electrode 4, the X− electrode 5, the Y+ electrode 6, and the Y− electrode 7, which are formed on the surface of the spherical crown unit 2 are formed in spherical zones B1 through B6 that have spacings that are gradually less along the Z direction from the spherical center O towards the apex P, and thus the surface area of each branch increases towards the base circle from the apex P, so that when the finger is moved towards the base circle from the apex P along the surface of the cover sheet 8, the electrostatic capacitances Cx+, Cx−, Cy+, and Cy− of the detection electrodes disposed in that direction will increase.

The result is that, as illustrated in FIG. 6(*b*), the voltage Vx+ that is inputted into the controlling circuit 24 when the common terminal of the switch 22 is connected to the X+ lead pattern 4*b* is decreased overall with the movement of the position of the input operation by the finger in the X+ direction from the apex P, and the voltage Vx− that is inputted into the controlling circuit 24 when the common terminal of the switch 22 is connected to the X− lead pattern 5*b* is decreased overall with the movement of the position of the input operation by the finger in the X− direction from the apex P. Each assumes the minimum value in the vicinity of the base circle.

Similarly, as illustrated in FIG. 6(*c*), the voltage Vy+ that is inputted into the controlling circuit 24 when the common terminal of the switch 22 is connected to the Y+ lead pattern 6*b* is decreased overall with the movement of the position of the input operation by the finger in the Y+ direction from the apex P, and the voltage Vy− that is inputted into the controlling circuit 24 when the common terminal of the switch 22 is connected to the Y− lead pattern 7*b* is decreased overall with the movement of the position of the input operation by the finger in the Y− direction from the apex P. Once again, each assumes the minimum value in the vicinity of the base circle.

Consequently, the input operation that progresses in the XY direction is either an operation towards the base circle from the apex P, or an operation towards the apex P from the base circle, and thus can be determined from the slopes of the voltages Vx+, Vx−, Vy+, and Vy−, in FIG. 6(*b*) and FIG. 6(*c*), for each of the detection voltages that are inputted into the controlling circuit 24 with the progress of the input operations, where if the slope is rising, then it is the former case, and if the slope is falling and then it is the latter case. The direction of the input operation on the XY plane can be determined as the direction of the input operation around the Z axis, as described above, so it is possible to detect the direction of the input operation on the XY plane from the slopes of the voltages Vx+, Vx−, Vy+, and Vy− that change during the input operation.

Furthermore, the speed of the input operation of the object to be detected in the X and Y directions can be detected from the time that elapses in the motion of the position of the input operation of the finger between different spherical zones B. The branch patterns that are formed for each of the individual circle zones B1 through B6 for each of the detection electrodes have the adjacent detection electrode branch pattern interposed in each spherical zone B in the direction of the input operation that passes through the apex P. Rather than the electrostatic capacitances Cx+, Cx−, Cy+, and Zy− increasing with a fixed ratio, proportionate to the distance of motion from the apex P towards the base circle, the rate of increase changes as each individual spherical zone B1 through B6 is passed. Because of this, the waveforms of the voltages Vx+, Vx−, Vy+ and Vy− that represent the changes in the electrostatic capacitances of each of the detection electrodes form an undulating waveform that produces minimum values and maximum values each time the input operation passes through the position of a spherical zone B1 through B6. Consequently, it is possible to detect the position of the input operation that traverses the individual spherical zones B from the position at which the minimum value occurs for any of the voltages Vx+, Vx−, Vy+, or Vy− wherein the voltage V changes, and possible to detect the speed of the input operation from the time that elapses between these minimum values occur and the distance between the spherical zones B along the arc that passes through the apex P.

For example, in the present example of embodiment, the spherical zones B1 through B6 are formed with the widths thereof gradually narrowing towards the apex P from the base circle side, so when there is an input operation from the base circle side towards the apex P, not only will the voltage V rise, but also there will be six local minimum values, corresponding to the spherical zones B1 through B6 in the waveform of the waveform that is rising. Because the distances along the arc between each of the spherical zones B are known in advance, it is possible to detect the speed of the input operation from the time that elapses therebetween.

The speed of the input operation may be detected from the time of the input operation that moves between any of the spherical zones B and the apex P, calculated in this way. The detection of the position of the input operation towards the apex P performs the detection through all of the voltages Vx+, Vx−, Vy+, and Vy− attaining a voltage that is less than Vmax. A reduction in the voltage of all of the voltages V indicates that the finger is facing all four of the detection electrodes that are formed divided into the four directions X+, X−, Y+, and Y−, with the apex P of the spherical crown unit 2 in the center, because the finger would not face all four of the detection electrodes unless there was an input operation by the finger positioned at the apex.

In regards to the waveforms of the voltages V that are changing, it is possible to determine sequentially that the position of the input operation is in the spherical zones B6, B5, B4, . . . , at each position wherein a minimum value occurs, starting from the position wherein the first minimum value occurs, in the direction in which the voltage V is dropping, from the voltage at which the position of the input operation indicated the apex P, and thus it is possible to detect the speed of the input operation from the amount of time that elapses and from the distance along the arc to one of the circle zones B from the apex P.

Moreover, because upon detecting an object all of the voltages Vx+, Vx−, Vy+, and Vy− assume voltages that are less than Vmax in this instruction inputting device 1, the device can be used as a non-contact switch that can input an ON and OFF switch input by merely bringing the object to be detected into proximity with the apex P.

Those skilled in the art will readily recognize numerous adaptations and modifications which can be made to the present invention which fall within the scope of the present invention as defined in the claims. Moreover, it is intended that the scope of the present invention include all foreseeable equivalents to the elements and structures as described with reference to FIGS. 1-7. Accordingly, the invention is to be limited only by the scope of the claims and their equivalents.

For example, in the present exemplary device 1, the spherical crown unit 2, which is an insulator, is a hemisphere wherein the base circle is assumed to be the great circle of an imaginary sphere. However, as long as the apex P is upward on the Z axis, a spherical crown shaped wherein a portion of a lower spherical zone is missing may be used, and the surface of the spherical crown unit 2 need not necessarily be perfectly spherical, but may be the surface of a spherical crown shaped.

Furthermore, in the exemplary device 1, while the electrostatic capacitances of each of the detection electrodes 4, 5, 6, and 7 is converted into voltages to detect the direction of the input operation and position of the input operation, and the like, from changes in voltages, the detection may instead be made by directly measuring the electrostatic capacitances.

Furthermore, while this exemplary device 1 executes an input operation using a finger as the object to be detected, another input operation tool aside from a finger can alternatively be used, insofar as it is grounded through the operator, or the like.

The present invention can be applied to an instruction inputting device for detecting the direction of a rotational operation, or the direction of an input operation in the XY direction, through an electrostatic capacitance method.

The invention claimed is:

1. An instruction inputting device comprising: an insulating spherical crown unit formed into a shape of a spherical crown with an apex above a Z axis of an imaginary sphere with the center thereof at an intersection of mutually orthogonal X−, Y−, and Z− axes; an X+ electrode formed in a strip-shape along a circumferential direction around the Z axis on a first hemisphere on one X direction side of the insulating spherical crown unit, having a plurality of X+ branch patterns that intersect an X+ arc that extends continuously from the apex to a base circle of the insulating spherical crown unit along the one X direction side, wherein widths of the strip-shape of the X+ electrode intersecting the X+ arc are gradually reduced in a direction moving towards the apex from the base circle;

an X− electrode formed in a strip-shape along the circumferential direction around the Z axis on a second hemisphere on an opposite X direction side of the insulating spherical crown unit, having a plurality of X− branch patterns that intersect an X− arc that extends continuously from the apex to the base circle of the insulating spherical crown unit along the opposite X direction, wherein widths of the strip-shape of the X− electrode intersecting the X- arc are gradually reduced in the direction moving towards the apex from the base circle;

a Y+ electrode formed in a strip-shape along the circumferential direction around the Z axis on a first hemisphere on one Y direction side of the insulating spherical crown unit, having a plurality of Y+ branch patterns that intersect a Y+ arc that extends continuously from the apex to the base circle of the insulating spherical crown unit along the one Y direction, wherein widths of the strip-shape of the Y+ electrode intersecting the Y+ arc are gradually reduced in the direction moving towards the apex from the base circle;

a Y− electrode formed in a strip-shape of the strip along the circumferential direction around the Z axis on a second hemisphere on an opposite Y direction side of the insulating spherical crown unit, having a plurality of Y− branch patterns that intersect a Y− arc that extends continuously from the apex to the base circle of the insulating spherical crown unit along the opposite Y direction, wherein widths of the strip-shape of the Y− electrode intersecting the Y− arc are gradually reduced in the direction moving towards the apex from the base circle;

and floating capacitance detecting means for detecting, respectively, changes in a floating capacitance of each of the X+ electrode, the X− electrode, the Y+ electrode, and the Y− electrode;

, each of the branch patterns are formed narrowing from a center of each respective branch pattern towards both sides of each respective branch pattern in the circumferential direction around the Z axis from an intersection-position of a circle in the X direction or the Y direction that passes through the apex so that adjacent electrodes do not overlap on a spherical surface of the spherical crown; and when there is an input operation performed that brings an object to be detected into proximity with the insulating spherical crown unit, the direction of the input operation in a X−Y plane of the object to be detected is detected from a change in floating capacitance of the X+ electrode and the X− electrode and a change in floating capacitance of the Y+ electrode and the Y− electrode, and a direction of rotational operation around the Z axis of the object to be detected is detected from changes in floating capacitances of at least one electrode and an adjacent electrode, wherein the at least one electrode and the adjacent electrode are electrodes selected from group consisting of: the X+ electrode, the X− electrode, the Y+ electrode, and the Y− electrode.

2. The instruction inputting device as set forth in claim 1, wherein, when the input operation brings the object to be detected into proximity with the spherical crown unit, the changes in the floating capacitances of one of the detecting electrodes and the adjacent detecting electrode are compared to detect a rotational position of the object to be detected around the Z axis.

3. The instruction inputting device as set forth in claim 1, wherein each electrode branch pattern forms the surface of the spherical crown unit that is partitioned by a spherical zone of each width of intersection, wherein each branch pattern intersects with a great circle into a shape that is a complement of a branch pattern of an adjacent respective electrode.

4. The instruction inputting device as set forth in claim 1, wherein each electrode branch pattern is formed so as to have point symmetry, in regards to the apex, and around the apex.

5. The instruction inputting device as set forth in claim 1, wherein the floating capacitance detecting means comprises a CV converting circuit for converting the floating capacitances of each individual detection electrode to voltages, and wherein, the floating capacitance detecting means detects the direction of rotational operation and a speed of rotational operation around the Z axis of the object to be detected from a change in an output voltage of the CV converting circuit.

6. The instruction inputting device as set forth in claim 2, wherein each electrode branch pattern forms the surface of the spherical crown unit that is partitioned by a spherical zone of the width of intersection, wherein each branch pattern intersects with a great circle into a shape that is a complement of a branch pattern of an adjacent respective electrode.

7. The instruction inputting device as set forth in claim 1, wherein each electrode branch pattern is formed so as to have point symmetry, in regards to the apex, around the apex.

8. The instruction inputting device as set forth in claim 2, wherein each electrode branch pattern is formed so as to have point symmetry, in regards to the apex, around the apex.

9. The instruction inputting device as set forth in claim 3, wherein each electrode branch pattern is formed so as to have point symmetry, in regards to the apex, around the apex.

10. The instruction inputting device as set forth in claim 6, wherein each electrode branch pattern is formed so as to have point symmetry, in regards to the apex, around the apex.

11. The instruction inputting device as set forth in claim 2, wherein the floating capacitance detecting means comprises a CV converting circuit for converting the floating capacitances of each individual detection electrode to voltages, and wherein, the floating capacitance detecting means detects the direction of rotational operation and a speed of rotational operation around the Z axis of the object to be detected from a change in an output voltage of the CV converting circuit.

12. The instruction inputting device as set forth in claim 3, wherein the floating capacitance detecting means comprises a CV converting circuit for converting the floating capacitances of each individual detection electrode to voltages, and wherein, the floating capacitance detecting means detects the direction of rotational operation and a speed of rotational operation around the Z axis of the object to be detected from a change in an output voltage of the CV converting circuit.

13. The instruction inputting device as set forth in claim 4, wherein the floating capacitance detecting means comprises a CV converting circuit for converting the floating capacitances of each individual detection electrode to voltages, and wherein, the capacitance detecting means detects the direction of rotational operation and a speed of rotational operation around the Z axis of the object to be detected from a change in an output voltage of the CV converting circuit.

14. The instruction inputting device as set forth in claim 6, wherein the floating capacitance detecting means comprises a CV converting circuit for converting the floating capacitances of each individual detection electrode to voltages, wherein, the floating capacitance detecting means detects the direction of rotational operation and a speed of rotational operation around the Z axis of the object to be detected from a change in an output voltage of the CV converting circuit.

15. The instruction inputting device as set forth in claim 7, wherein the floating capacitance detecting means comprises a CV converting circuit for converting the floating capacitances of each individual detection electrode to voltages, wherein, the floating capacitance detecting means detects the direction of rotational operation and a speed of rotational operation around the Z axis of the object to be detected from the change in the output voltage of the CV converting circuit.

16. The instruction inputting device as set forth in claim 8, wherein the floating capacitance detecting means comprises a CV converting circuit for converting the floating capacitances of each individual detection electrode to voltages, and wherein, the floating capacitance detecting means detects the direction of rotational operation and a speed of rotational operation around the Z axis of the object to be detected from a change in an output voltage of the CV converting circuit.

17. The instruction inputting device as set forth in claim 9, wherein the floating capacitance detecting means comprises a CV converting circuit for converting the floating capacitances of each individual detection electrode to voltages, and wherein, the floating capacitance detecting means detects the direction of rotational operation and a speed of rotational operation around the Z axis of the object to be detected from a change in an output voltage of the CV converting circuit.

18. The instruction inputting device as set forth in claim 10, wherein the floating capacitance detecting means comprises a CV converting circuit for converting the floating capacitances of each individual detection electrode to voltages, and wherein, the floating capacitance detecting means detects the direction of rotational operation and a speed of rotational operation around the Z axis of the object to be detected from a change in an output voltage of the CV converting circuit.

19. The instruction inputting device as set forth in claim 2, wherein the input operation bringing the object to be detected into proximity with the apex causes an increase in all of the floating capacitances of the X+ electrode and X− electrode and the floating capacitances of the Y+ electrode and Y− electrode, thereby enabling the apex to act as a button switch for “on” and “off” inputs.

* * * * *